(12) United States Patent
Lüdtke

(10) Patent No.: US 8,575,051 B2
(45) Date of Patent: Nov. 5, 2013

(54) HEAT SINK HAVING A HIGH THERMAL CONDUCTIVITY

(75) Inventor: Arndt Lüdtke, Reutte (AT)

(73) Assignee: Plansee SE, Reutte (AT)

( * ) Notice: Subject to any disclaimer, the term of this patent is extended or adjusted under 35 U.S.C. 154(b) by 1122 days.

(21) Appl. No.: 10/548,725

(22) PCT Filed: Jan. 20, 2004

(86) PCT No.: PCT/AT2004/000018
§ 371 (c)(1),
(2), (4) Date: Oct. 3, 2005

(87) PCT Pub. No.: WO2004/080914
PCT Pub. Date: Sep. 23, 2004

(65) Prior Publication Data
US 2006/0130998 A1 Jun. 22, 2006

(30) Foreign Application Priority Data
Mar. 11, 2003 (AT) .......................... GM 164/2003 U

(51) Int. Cl.
*C04B 35/52* (2006.01)

(52) U.S. Cl.
USPC ............................................. 501/90; 501/94

(58) Field of Classification Search
USPC ..................................................... 501/90, 94
See application file for complete search history.

(56) References Cited

U.S. PATENT DOCUMENTS

| 4,680,618 | A | * | 7/1987 | Kuroda et al. ............. 257/746 |
| 4,735,655 | A |   | 4/1988 | Weis et al. |
| 5,045,972 | A |   | 9/1991 | Supan et al. |
| 5,706,999 | A | * | 1/1998 | Lim et al. ................... 228/123.1 |
| 6,039,641 | A |   | 3/2000 | Sung |
| 6,171,691 | B1 | * | 1/2001 | Nishibayashi ................ 428/325 |
| 6,179,886 | B1 |   | 1/2001 | Gordeev et al. |

FOREIGN PATENT DOCUMENTS

| EP | 0 475 575 A1 | 3/1992 |
| EP | 0 691 413 A3 | 2/1996 |
| EP | 0 898 310 A2 | 2/1999 |
| JP | 2001339022 A | 12/2001 |
| WO | 00/18702 | 4/2000 |
| WO | 02/42240 A2 | 5/2002 |
| WO | WO 02/42240 | * 5/2002 |

OTHER PUBLICATIONS

Fluck, E. "New Notations in the Periodic Table", 1988, Pure & Applied Chemistry, vol. 60 No. 3 pp. 431-436.*

* cited by examiner

*Primary Examiner* — Nicholas P D'Aniello
(74) *Attorney, Agent, or Firm* — Laurence A. Greenberg; Werner H. Stemer; Ralph E. Locher

(57) ABSTRACT

The invention relates to a heat sink comprising a diamond-containing composite material. In addition to a diamond content of 40-90% by volume, the composite material further comprises from 0.005 to 12% by volume of a silicon-carbon compound, from 7 to 49% by volume of an Ag-, Au- or Al-rich phase and less than 5% by volume of a further phase, with the volume ratio of the Ag-, Au or Al-rich phase to silicon carbide being greater than 4 and at least 60% of the diamond surface being covered by the silicon-carbon compound. Preferred production processes include atmospheric pressure and pressure-aided infiltration techniques. The component is suitable, in particular, as heat sink for semiconductor components.

14 Claims, No Drawings

HEAT SINK HAVING A HIGH THERMAL CONDUCTIVITY

BACKGROUND OF THE INVENTION

Field of the Invention

The invention relates to a component as heat sink comprising a composite material having a diamond content of 40-90% by volume and a mean size of the diamond grains of from 5 to 300 µm, and a process for producing it.

Heat sinks are widely used in the production of electronic components. Apart from the heat sink, semiconductor components and a mechanically stable encapsulation are the essential constituents of an electronic package. The terms substrate, heat spreader or support plate are frequently also used for the heat sink. The semiconductor component comprises, for example, single-crystal silicon or gallium arsenide. This is connected to the heat sink, usually using soldering methods as joining technique. The heat sink has the function of conducting away heat produced during operation of the semiconductor component. Semiconductor components which produce a particularly large quantity of heat are, for example, LDMOS (laterally diffused metal oxide semiconductor), laser diodes, CPU (central processing unit), MPU (microprocessor unit) or HFAD (high frequency amplify device).

The geometric configurations of the heat sink are specific to the application and may vary widely. Simple forms are flat plates. However, substrates having a complex configuration with recesses and steps are also used. The heat sink itself is in turn joined to a mechanically stable encapsulation.

The coefficients of thermal expansion of the semiconductor materials used are low compared to other materials and are reported in the literature as from $2.1 \times 10^{-6}$ $K^{-1}$ to $4.1 \times 10^{-6}$ $K^{-1}$ for silicon and from $5.6 \times 10^{-6}$ $K^{-1}$ to $5.8 \times 10^{-6}$ $K^{-1}$ for gallium arsenide.

Other semiconductor materials which are not yet widely used in industry, e.g. Ge, In, Ga, As, P or silicon carbide, also have similarly low coefficients of expansion. Ceramic materials, material composites or plastics are usually used for the encapsulation. Examples of ceramic materials are $Al_2O_3$ with a coefficient of expansion of $6.5 \times 10^{-6}$ $K^{-1}$ or aluminum nitride having a coefficient of expansion of $4.5 \times 10^{-6}$ $K^{-1}$.

If the expansion behavior of the participating components is different, stresses are incorporated in the composite, and these lead to distortion, to detachment of material or to fracture of the components. Stresses can arise during manufacture of the package and during the cooling phase from the soldering temperature to room temperature. However, temperature fluctuations also occur during operation of the package, and these can extend, for example, from −50° C. to 200° C. and lead to thermal mechanical stresses in the package.

These factors determine the requirements for the material for the heat sink. Firstly, it should have a very high thermal conductivity in order to keep the temperature rise of the semiconductor component during operation as low as possible. Secondly, it is necessary for the coefficient of thermal expansion to be matched as well as possible to that of the semiconductor component and also that of the encapsulation. Single-phase metallic materials do not meet the required property profile sufficiently well, since the materials having a high thermal conductivity also have a high coefficient of thermal expansion.

Accordingly, composite materials or material composites are used for producing the substrate in order to meet the requirement profile.

Conventional tungsten-copper and Mo-copper composite materials or material composites as described, for example, in EP 0 100 232, U.S. Pat. No. 4,950,554 and U.S. Pat. No. 5,493,153 have a thermal conductivity at room temperature of from 170 to 250 W/(m·K) at a coefficient of thermal expansion of from $6.5 \times 10^{-6}$ to $9.0 \times 10^{-6}$ $K^{-1}$, which is no longer sufficient for many applications.

With the increasing demands made on the thermal conductivity of heat sinks, diamond and diamond-containing composite materials or material composites also came into the picture. Thus, the thermal conductivity of diamond is from 1000 to 2000 W/(m·K), with the content of nitrogen and boron atoms on lattice sites being of special importance for determining the quality.

EP 0 521 405 describes a heat sink which has a polycrystalline diamond layer on the side facing the semiconductor chip. The absence of plastic deformability of the diamond layer can lead to cracks in the diamond layer even during cooling from the coating temperature.

U.S. Pat. No. 5,273,790 describes a diamond composite material having a thermal conductivity of >1700 W/(m·K) in the case of which loose diamond particles brought to shape are converted into a stable shaped body by means of subsequent diamond deposition from the gas phase. The diamond composite produced in this way is too expensive for commercial use in mass-produced parts.

WO 99/12866 describes a process for producing a diamond-silicon carbide composite material. It is produced by infiltration of a diamond skeleton with silicon or a silicon alloy. Owing to the high melting point of silicon and the resulting high infiltration temperature, diamond is partly converted into carbon or subsequently into silicon carbide. Owing to the high brittleness, the mechanical forming of this material is highly problematical and costly, so that this composite material has hitherto not yet been used for heat sinks.

U.S. Pat. No. 4,902,652 describes a process for producing a sintered diamond material. An element from the group of transition metals of groups 4a, 5a and 6a, boron and silicon are deposited onto diamond powder by means of physical coating methods in this process. The coated diamond grains are subsequently joined to one another by means of a solid-state sintering process. Disadvantages are that the product formed has a high porosity and a coefficient of thermal expansion which is too low for many applications.

U.S. Pat. No. 5,045,972 describes a composite material in which diamond grains having a size of from 1 to 50 µm and also a metallic matrix comprising aluminum, magnesium, copper, silver or an alloy thereof are present. A disadvantage is that the metallic matrix is bound only unsatisfactorily to the diamond grains, so that, as a result, the thermal conductivity and mechanical integrity are not sufficient.

The use of finer diamond powder, for example diamond powder having a particle size of <3 µm, as is described in U.S. Pat. No. 5,008,737, also does not improve diamond/metal adhesion.

U.S. Pat. No. 5,783,316 describes a process in which diamond grains are coated with W, Zr, Re, Cr or titanium, the coated grains are subsequently compacted and the porous body is infiltrated, for example, with Cu, Ag or Cu—Ag melts. The high coating costs limit the uses of composite materials produced in this way.

EP 0 859 408 describes a material for heat sinks whose matrix is made up of diamond grains and metal carbides, with the interstices of the matrix being filled by a metal. As metal carbides, mention is made of the carbides of metals of groups 4a to 6a of the Periodic Table. TiC, ZrC and HfC are particularly emphasized in EP 0 859 408. Ag, Cu, Au and Al are said to be particularly advantageous filler metals. A disadvantage is that the metal carbides have a low thermal conductivity, which in the case of TiC, ZrC, HfC, VC, NbC and TaC is in the range from 10 to 65 W/(m·K). A further disadvantage is that the metals of groups 4a to 6a of the Periodic Table have a degree of solubility in the filler metal, for example silver, as a result of which the thermal conductivity of the metal phase is greatly reduced.

EP 0 893 310 describes a heat sink comprising diamond grains, a metal or a metal alloy having a high thermal conductivity from the group consisting of Cu, Ag, Au, Al, Mg and Zn and a metal carbide of the metals of groups 4a, 5a and Cr, with the metal carbides covering at least 25% of the surface of the diamond grains. Here too, the poor thermal conductivity of the carbides of groups 4a, 5a of the Periodic Table and Cr and the high solubility of these elements in Cu, Ag, Au, Al, Mg and Zn and the associated reduction in the thermal conductivity are disadvantageous.

In recent years, the process speed and the degree of integration of semiconductor components have increased greatly, which has also led to an increase in evolution of heat in the package. Optimal heat management is therefore an evermore important criterion. The thermal conductivity of the above-described materials is no longer sufficient for many applications, or their production is too costly for widespread use. The availability of improved, inexpensive heat sinks is a prerequisite for further optimization of semiconductor components.

SUMMARY OF THE INVENTION

It is therefore an object of the present invention to provide a composite material for a component intended as heat sink, which material has a high thermal conductivity and a low coefficient of expansion combined with processing properties which make inexpensive manufacture possible. This object is achieved by a component as claimed in claim 1.

The component of the invention displays excellent adhesion between the diamond grains and the Ag-, Au- or Al-rich phase due to the silicon-carbon compound formed between them. To achieve this bonding, a thickness of this silicon-carbon compound in the nanometer range, or a degree of cover of >60%, is sufficient. For the present purposes, the degree of cover is the proportion of the surface of the diamond grains which is covered by the silicon-carbon compound. Under these premises, this corresponds to a volume content of the silicon-carbon compound of >0.005%.

In contrast to metal carbides, silicon carbide has a very high thermal conductivity of about 250 W/(m·K). Since the solubility of Si in Ag, Au and Al is very low at room temperature, the very high thermal conductivity of these metals in the pure state is reduced only slightly. Alloys of Ag, Au or Al with Cu or Ni likewise have a sufficiently high thermal conductivity which is not reduced to an unacceptably high degree by small amounts of dissolved Si.

Furthermore, the mechanical formability is ensured to a sufficient extent because of the very ductile Ag, Au or Al microstructure constituents. A further advantage for inexpensive production is that the high thermal conductivity of the Ag-, Au- or Al-rich microstructure constituents enables the diamond content to be reduced. Variation of the diamond, silicon carbide and metal phase contents make it possible to produce heat sinks for a variety of requirements to be tailored in respect of thermal conductivity and thermal expansion.

Further microstructure constituents do not worsen the properties to an unacceptable degree as long as their content does not exceed 5% by volume. Constituents of this type which may be mentioned are free silicon and free carbon. Although these microstructure constituents increase the thermal conductivity slightly, they have a favorable effect on the coefficient of thermal expansion by reducing the latter. In addition, they can sometimes only be avoided completely with a relatively high degree of difficulty in terms of the production process.

Particularly advantageous contents of silicon carbide and Ag-, Au- or Al-rich phase are from 0.1 to 7% by volume and from 7 to 30% by volume, respectively. Experiments have shown that diamond powder can be processed within a wide particle size spectrum. Apart from natural diamonds, it is also possible to process more inexpensive synthetic diamonds. Excellent processing results have also been achieved using the customary coated diamond types. As a result, the most inexpensive type in each case can be employed. In the case of applications in which the thermal conductivity has to meet extremely high requirements and cost is not critical, it is advantageous to use a diamond fraction having a mean particle size in the range from 50 to 150 µm. Furthermore, the highest thermal conductivity values can be achieved by the use of Ag at contents of from 20 to 30% by volume.

For use of the components as heat sinks for electronic components, they are advantageously coated with Ni, Cu, Au or Ag or an alloy of these metals and subsequently soldered using a ceramic frame, for example of $Al_2O_3$ or AlN.

For producing the composite, a variety of methods can be employed. Thus, it is possible to densify SiC-coated diamond powder with Ag, Au or Al at elevated temperature and under pressure. This can be effective, for example, in hot presses or hot isostatic presses. Infiltration has been found to be particularly advantageous. Here, a precursor or intermediate which may also contain a binder in addition to diamond powder is produced. Binders which pyrolize to a large extent under the action of heat are particularly advantageous. Advantageous binder contents are from 1 to 20% by weight. Diamond powder and binder are mixed in customary mixers or mills. The mixture is then shaped, which can be carried out by pouring into a mold or with the aid of pressure, for example by pressing or metal powder injection molding. The intermediate is subsequently heated to a high temperature at which the binder is at least partially pyrolized. However, the pyrolysis of the binder can also occur during heating in the infiltration process. The infiltration process can be carried out at atmospheric pressure or with the aid of pressure. The latter is usually referred to as squeeze casting. As infiltration material, it is advantageous to use a film of an Ag—Si, Au—Si or Al—Si alloy having an Si content of <50% by weight. In choosing the composition, it has to be ensured that the liquidus temperature of the respective alloy is not higher than 1200° C., advantageously not higher than 1000° C., since the proportion of diamond which decomposes is otherwise too high. Films having a eutectic composition are particularly suitable for infiltration. Apart from the particularly advantageous use of the components for conducting away heat in semiconductor components, the composite material of the invention can also be used as heat sinks in other applications, for example in the aerospace field or in engine construction.

The invention is illustrated below by means of production examples.

EXAMPLE 1

Natural diamond powder of the grade IIA (Micron+SND from Element Six GmbH) having a mean particle size of 40-80 µm was mixed with 7% by volume of a binder based on epoxide resin. The precursor or intermediate produced in this way was pressed by means of die pressing at a pressure of 200

MPa to give a plate having dimensions of 35 mm×35 mm×5 mm. The porosity of the plate was about 15% by volume.

This plate was subsequently covered with a film composed of a eutectic Ag—Si alloy having an Si content of 11 atom % and, to carry out the infiltration, was heated in a furnace to a temperature of 860° C. under reduced pressure, with the hold time being 15 minutes. After cooling to room temperature with a hold point at 400° C. for about 10 minutes, the volume contents of the phases present were determined by means of quantitative metallography.

The value for silicon carbide was about 2% by volume, with the silicon carbide mostly enveloping the diamond grains uniformly. Owing to the low thickness of this silicon carbide shell, the modification of the silicon carbide phase could not be determined. Apart from diamond and silicon carbide, the microstructure comprises an Ag-rich phase with embedded Si precipitates which have been formed by the eutectic reaction. The proportion by volume of the Ag-rich phase was about 12%, and that of Si was about 1%. No further constituents apart from Ag could be detected in the Ag-rich phase by means of EDX, so that it can be assumed on the basis of the applicable detection limit that the proportion of Ag is greater than 99 atom %.

To determine the thermal conductivity and the coefficient of thermal expansion, the plate was processed by means of a laser and erosion. A mean value of 450 W/(m·K) was measured for the thermal conductivity at room temperature. The determination of the coefficient of thermal expansion gave a mean value of $8.5 \times 10^{-6}$ $K^{-1}$.

EXAMPLE 2

In a further experiment, synthetic diamond powder of the grade Micron+MDA from Element Six GmbH having a mean particle size of 40-80 μm was processed. Processing was carried out as described in Example 1. The mean thermal conductivity at room temperature of the composite material produced in this way was 410 W/(m·K), and the mean coefficient of thermal expansion was $9.0 \times 10^{-6}$ $K^{-1}$.

EXAMPLE 3

In a further experiment, synthetic diamond powder of the grade Micron+MDA from Element Six GmbH having a mean particle size of 40-80 μm was processed. The production of the precursor was carried out as described in Example 1. The infiltration of the pressed precursor with a eutectic Ag—Si melt was carried out at a gas pressure of about 40 MPa in a conventional squeeze casting apparatus whose hot forming steel mold had been preheated to 150° C. The temperature of the Ag—Si melt was about 880° C. The subsequent, slow cooling to room temperature was carried out with a hold point at 400° C. for about 15 minutes. The mean thermal conductivity at room temperature of the composite material produced in this way was 480 W/(m·K), and the mean coefficient of thermal expansion was $8.5 \times 10^{-6}$ $K^{-1}$.

EXAMPLE 4

Synthetic diamond powder of the grade Micron+MDA from Element Six GmbH having a mean particle size of 40-80 μm was processed as described in Example 3, but without a hold phase at about 400° C. for 15 minutes being carried out during cooling from the infiltration temperature. The mean thermal conductivity at room temperature of the composite material produced in this way was 440 W/(m·K), and the mean coefficient of thermal expansion was $8.5 \times 10^{-6}$ $K^{-1}$.

I claim:

1. A heat sink component, comprising:
   a composite material containing free silicon and having
   a diamond content of from 40 to 90% by volume with diamond grains having a mean size of from 5 to 300 μm;
   0.005 to 12% by volume of silicon carbide;
   7 to 49% by volume of an Ag-rich, Au-rich, or Al-rich phase comprising Ag, Au, or Al, respectively, as a principal element;
   less than 5% by volume of a further phase;
   wherein a volume ratio of said Ag-rich, Au-rich, or Al-rich phase to said silicon carbide is greater than 4, and wherein at least 60% of a surface of said diamond grains is covered by said silicon carbide;
   said composite material being formed into a heat sink component.

2. The component according to claim 1, wherein said Ag-rich, Au-rich, or Al-rich phase comprises at least 95 atom % of Ag, Au, or Al, respectively.

3. The component according to claim 1, wherein said Ag-rich, Au-rich, or Al-rich phase further comprises at least one of Cu and Ni.

4. The component according to claim 3, wherein said Ag-rich, Au-rich, or Al-rich phase further comprises Si.

5. The component according to claim 1, wherein said composite material contains from 0.1 to 4.5% by volume of free silicon.

6. The component according to claim 1, wherein said composite material contains from 0.1 to 4.5% by volume of free carbon.

7. The component according to claim 1, wherein said silicon carbide is formed predominantly by reaction of silicon with a carbon of said diamond.

8. The component according to claim 1, wherein said silicon carbide is formed substantially exclusively by reaction of silicon with a carbon of said diamond.

9. The component according to claim 1, wherein said diamond content has a particle size is from 50 to 150 μm.

10. The component according to claim 1, wherein said composite material comprises from 0.01 to 12% by volume of silicon carbide and from 7 to 49% by volume of said Ag-rich, Au-rich or Al-rich phase.

11. The component according to claim 1, wherein said composite material comprises from 0.01 to 7% by volume of silicon carbide and from 7 to 49% by volume of Ag.

12. The component according to claim 1, which further comprises a metallic coating comprising Ni, Cu, Au, Ag or an alloy thereof.

13. The component according to claim 1, which further comprises a ceramic frame welded onto said heat sink component.

14. In combination with a semiconductor component, the heat sink component according to claim 1 disposed to form a heat sink for the semiconductor component.

* * * * *